United States Patent [19]

Nakamura et al.

[11] 4,361,887
[45] Nov. 30, 1982

[54] SEMICONDUCTOR LIGHT EMITTING ELEMENT

[75] Inventors: Michiharu Nakamura; Motohisa Hirao, both of Tokyo; Shigeo Yamashita, Hachioji; Tadashi Fukuzawa, Tokyo; Junichi Umeda, Hachioji, all of Japan

[73] Assignee: Hitachi, Ltd., Tokyo, Japan

[21] Appl. No.: 125,779

[22] Filed: Feb. 29, 1980

[30] Foreign Application Priority Data

Mar. 2, 1979 [JP] Japan .................. 54-23453

[51] Int. Cl.³ ............................... H01S 3/19
[52] U.S. Cl. ................................ 372/50; 357/17; 357/41; 372/45
[58] Field of Search ............... 357/17, 18, 41; 372/50; 331/94.5 H

[56] References Cited

U.S. PATENT DOCUMENTS 4,065,729 12/1977 Gover et al. ............ 331/94.5 H
4,212,020 2/1980 Yariv et al. ............ 331/94.5 H X

OTHER PUBLICATIONS

Fang et al., "Integrated Optoelectronic Display System" *IBM Technical Disclosure Bulletin*, vol. 19, No. 6, Nov, 1976, pp. 2340-2341.
Casey et al., "III-V Binary and Quaternary Lattice-Matching Systems for Hetero-Structure Lasers", *Heterostructure Lasers,* H. C. Casey, Jr. et al., ©1978, pp. 32-48.
Ury et al., "Monolithic Integration of an Injection Laser and a Metal Semiconductor Field Effect Transistor Appl. Phys. Lett. 34(7), Apr. 1, 1979, pp. 430-431.
Fukuzawa et al., "Monolithic Integration of a GaAlAs Injection Laser with a Schottky-Gate Field Effect Transistor", Appl. Phys. Lett. vol. 36, No. 3, Feb. 1, 1980, pp. 181-183.

*Primary Examiner*—James W. Davie
*Attorney, Agent, or Firm*—Antonelli, Terry & Wands

[57] ABSTRACT

A semiconductor laser light emitting element comprises a semiconductor substrate, a laminate region of semiconductor layers having at least a first, a second and a third semiconductor layer formed over the substrate and having a p-n junction defined therein. The first and third semiconductor layers have smaller refractive indices and greater forbidden band gaps than the second semiconductor layer and are opposite in conductivity type to each other. Provided are on the substrate a field effect transistor section having first and second electrodes and a gate electrode disposed between the first and second electrodes, a means for serving as an optical resonator for emitting light in the lengthwise direction of the p-n junction. A means is formed on one surface of the laminate region for injecting current into the third semiconductor layer, the current injection means is short-circuited with the first electrode of the field transistor section and a means is formed on the substrate for receiving the current injected from the current injecting means.

9 Claims, 14 Drawing Figures

SEMICONDUCTOR LIGHT EMITTING ELEMENT

This invention relates to a semiconductor light emitting element and a method for producing the same, which element has such a novel structure that its third electrode is used to control the modulation on the semiconductor laser element.

A semiconductor laser element provides a wide application in, for example, optical communication systems such as data bus or computer-link since it is small in size and capable of performing rapid modulation.

The modulation of a semiconductor laser element is usually performed in such a manner as described below. A direct current is sent through a circuit element called a bias-T unit, consisting of a capacitor and a coil, from the side of the coil; the excitation concentration is raised up to near the laser oscillation threshold; and the laser output light is modulated through the superposition of a current pulse of 30 to 70 mA sent from the side of the capacitor. Such apparatus have been put on the market. However, in the case where a high speed modulation of 1 to 2 G bit/sec. is desired according to the above method, it is difficult for ordinary silicon transistors to generate current pulses which are suitable for the high speed modulation. Moreover, the bias-T unit is very voluminous in comparison with the laser element, and the size of a laser apparatus incorporating therein many laser elements cannot be made compact.

It is therefore the object of this invention to provide a semiconductor light emitting element having a novel structure, in which the semiconductor laser element is modulated by a field effect transistor formed integrally in the same substrate that contains therein the semiconductor laser element.

According to the present invention there is provided a semiconductor light emitting element, which comprises a semiconductor substrate; a laminate region of semiconductor layers having at least a first, a second and a third semiconductor layer formed over the substrate and having a p-n junction defined therein, the first and third semiconductor layers having smaller refractive indices and greater forbidden band gaps than the second semiconductor layer and being opposite in conductivity type to each other; a field effect transistor (FET) section having first and second electrodes and a gate electrode disposed between the first and second electrodes of the transistor section; a means for serving as an optical resonator for emitting light in the lengthwise direction of the p-n junction; a means formed on one surface of the laminate region for injecting current into the third semiconductor layer, the current injecting means being short-circuited with the first electrode of the field effect transistor section; and a means formed on the substrate for receiving the current injected from the current injecting means.

Other objects, features and advantages of this invention will be apparent when one reads the following description of this invention in conjunction with the attached drawings, in which FIG. 1 shows in cross section an SLEE (semiconductor light emitting element) as a typical example of this invention;

Figure 1:
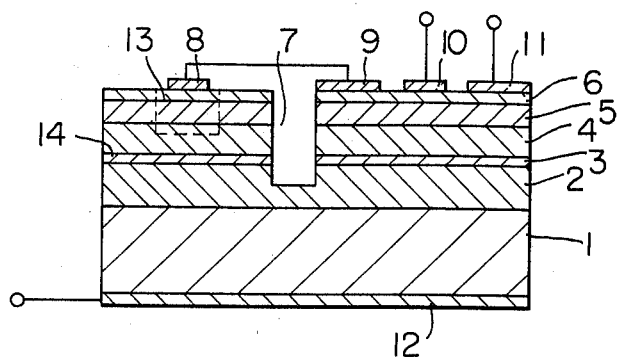
FIG. 1 shows in cross section an SLEE as a typical embodiment of this invention, the section being taken perpendicular to the direction of the propagation of the laser beam.

On a semiconductor substrate 1 are formed in lamination through a crystal growth technique a first, a second and a third semiconductor layer 2, 3 and 4 for constituting a semiconductor laser element. And a laminated region consisting of a fourth semiconductor layer 5 having a high resistivity and a fifth semiconductor layer 6 serving as a channel of an FET, is formed on the lamination of the layers 2, 3 and 4. The first, second and third semiconductor layers 2, 3 and 4 serve respectively as the first clad layer, the active layer and the second clad layer, of the semiconductor laser element. Naturally, the first and the third semiconductor layers 2 and 4 have smaller refractive indices and also greater forbidden band gaps, than the second semiconductor layer 3 and are opposite in conductivity type to each other.

The fourth semiconductor layer 5 must have a resistivity of higher than 10 $\Omega \cdot cm$ and in practice it should range from 100 $\Omega \cdot cm$ to 1 $K\Omega \cdot cm$. This layer 5 is necessary for the electrical separation of the semiconductor laser element from the FET.

A groove 7 is cut to provide isolation between the laser section and the FET section. This groove 7 may be eliminated if the laser element and the FET are appropriately designed, but the provision of the groove 7 is preferable. The groove 7 may be filled with inorganic insulator such as $SiO_2$ or resin to improve insulation. Moreover, instead of cutting the groove 7, ion implantation may be employed to form a region having a high resistivity for serving as an insulating region. The provision of one of these isolation means should be the well-known techniques in the field of semiconductor laser or device.

If the above described SLEE is to be fabricated by the use of a material of GaAs-GaAlAs system, each of the semiconductor layers is selected as follows 1st semiconductor layer:

$Ga_{1-x}Al_xAs$ (0.2 ≤ x ≤ 0.7)

thickness 1 to 3 $\mu m$

2nd semiconductor layer:

$Ga_{1-y}Al_yAs$ (0 ≤ y ≤ 0.3)

thickness 0.05 to 0.3 $\mu m$

3rd semiconductor layer:

$Ga_{1-z}Al_zAs$ (0.2 ≤ z ≤ 0.7)

thickness 1 to 3 $\mu m$

4th semiconductor layer:

$Ga_{1-s}Al_sAs$ (0 ≤ s ≤ 0.7)

thickness 0.5 to 5 $\mu m$
resistivity 10 $\Omega \cdot cm$ or above

5th semiconductor layer:

$Ga_{1-t}Al_tAs$ ($0 \leq t \leq 0.3$)

thickness 0.1 to 0.3 μm

Electrodes 8 and 12 are attached respectively to the p-type and the n-type layers of the semiconductor laser element. Electrodes 9, 10 and 11 are respectively the source, gate and drain electrodes of the FET. The electrodes 8, 9, 11 and 12 are ohmic electrodes and the electrode 10 is a Schottky electrode. A region 13 is formed through the selective diffusion of Zn, serving as an electrode attaching portion for the semiconductor laser element.

The sectional planes perpendicular to the direction of the propagation of laser beam, formed by, for example, the well-known cleaving, are so treated as to serve as reflective surfaces to provide an optical resonator.

Figure 2:
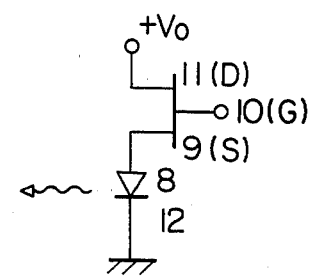
FIG. 2 is an equivalent circuit of the SLEE shown in FIG. 1.

When the electrodes 8 and 9 of the SLEE described above are connected by a conductor and when a voltage is applied between the electrodes 11 and 12, a laser emission takes place. The equivalent circuit of this constitution shown in FIG. 1 is as shown in FIG. 2. Reference numerals in FIG. 2 designate the corresponding parts in FIG. 1. S, D and G indicate the source, drain and gate of the FET. Accordingly, the laser resonance can be controlled by applying a control voltage to the gate electrode 10.

The structure in which the resonance of the semiconductor laser element can be controlled by the control electrode, i.e. gate electrode, has the following merits.

(1) The laser light intensity can be modulated by a voltage pulse. Since the control electrode is reversely biassed, little current flows for control. Therefore, the semiconductor laser element can be turned on and off by the output signal derived from an ordinary silicon IC (integrated circuit) such as TTL (transistor-transistor logic) circuit.

(2) High-speed modulation can be effected. The modulation speed is determined depending on the response speed of the FET section and the modulation speed of the laser section, reaching a rate of 1 G bit/sec. or above.

The SLEE shown in FIG. 1 comprises the first to the fifth semiconductor layers piled in lamination and the semiconductor laser element and the FET are constructed in the desired regions. This structure is most adapted for a simple production method. However, the structure of the SLEE according to this invention is not limited to that described above. For example, the first, second and third semiconductor layers constituting the laser element and the fourth and fifth semiconductor layers serving as the FET may be separately formed by crystal growth technique, within the scope and spirit of this invention. Other structural examples of the invention will be described as embodiments. Further, numerous variations can be thought of with respect to the SLEE wherein the FET is connected with one of the electrodes of the laser element. Also, the material is not limited to those mentioned above and in the following description of the embodiment. For example, semiconductor of InP-InGaAsP or GaAlSbAs system is a recommendable material. Various means for stabilizing the mode of a semiconductor laser, which have hitherto proposed, may be applied well to the laser section of the SLEE according to this invention.

EMBODIMENT 1

FIGS. 3 to 8 show in sectional view the steps of a process for producing an SLEE as an embodiment of this invention.

Figure 3:
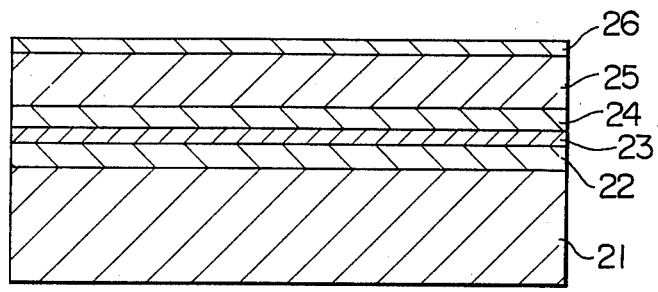
FIG. 3 to FIG. 8 show in cross section the steps of a process for producing an SLEE, as an embodiment of this invention.

An n-type GaAs substrate (with electron concentration $n \approx 10^{18}/cm^3$) 21 has the following layers formed on its (100) plane by the well-known liquid phase epitaxial growth method using a sliding board: a first semiconductor layer 22 of n-type $Ga_{0.7}Al_{0.3}As$ ($n \approx 5 \times 10^{17}/cm^3$), 2 μm thick; a second semiconductor layer 23 of n-type GaAs ($n \approx 10^{16}/cm^3$), 0.1 μm thick; a third semiconductor layer 24 of p-type $Ga_{0.7}Al_{0.3}As$ (hole concentration $p \approx 5 \times 10^{17}/cm^3$), 1 μm thick; a fourth semiconductor layer 25 of p-type $Ga_{0.7}Al_{0.3}As$ ($p \approx 1 \times 10^{14}/cm^3$, resistivity $\approx 600$ Ω·cm), 1 μm thick); and a fifth semiconductor layer 26 of n-type GaAs ($n \approx 2 \times 10^{17}/cm^3$), 0.3 μm thick. The fourth semiconductor layer 25 need not always contain Al and may be formed of p-type GaAs ($p \approx 1 \times 10^{12}/cm^3$) having a high resistivity. FIG. 3 shows in cross section the thus completed lamination.

Figure 4:
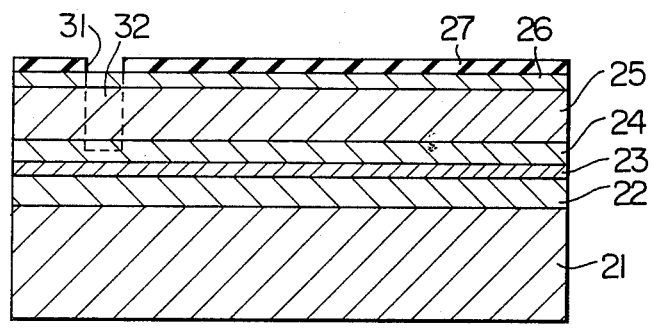

Then, a double layer 27 of $Al_2O_3$, 0.2 μm thick, and $SiO_2$, 0.3 μm thick, is formed by the well-known CVD (chemical vapor deposition) method. That portion, 6 μm wide, of the double layer 27 which corresponds to the electrode attaching portion of the semiconductor laser element is removed. The etching solutions to be used are a mixture solution of hydrogen fluoride and ammonium fluoride (for 1:6 $SiO_2$) and a solution of phosphoric acid (for $Al_2O_2$). The $SiO_2$-$Al_2O_3$ double layer 27 serves as a mask for selective diffusion. Through the opening of the mask 27 are diffused Zn atoms, by the well-known diffusion technique, the diffused region having a width of 6 μm and reaching the third semiconductor layer 24. FIG. 4 shows the completion of this step.

Figure 5:
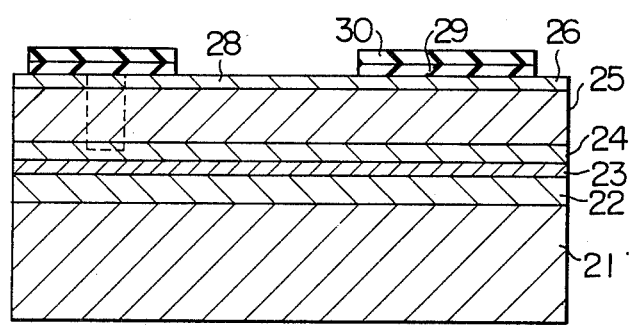
Figure 6:
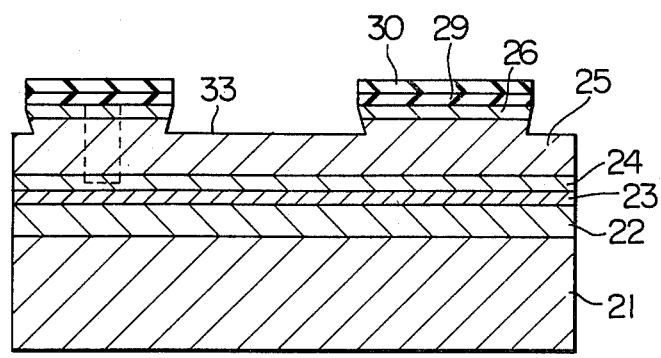

The entire double layer 27 serving as the diffusion mask is removed and a $SiO_2$ film 27, 5000 Å thick, is formed by the CVD method. A photoresist film 30 is then formed on the $SiO_2$ film 29 and an opening 28 is formed in the $SiO_2$ film 29 by the use of an ordinary photo-lithographic technique. FIG. 5 shows the completion of this step. By using the remaining $SiO_2$ film 29 as an etching mask, the fifth and fourth semiconductor layers 26 and 25 are subjected to mesa-etching. The solution to be used for etching is a mixture solution of phosphoric acid, hydrogen peroxide and ethylene glycol (1:1:8). The groove 33 resulting from the etching may have such a depth that its bottom may reach the first semiconductor layer 22 as shown in FIG. 1, but it is only necessary for the bottom of the groove 33 to reach the fourth semiconductor layer 25. It is preferable that the groove should be shallow if a vauum-deposited film of metal is used to short-circuit between the p-type electrode of the laser element and the drain electrode of the FET. FIG. 6 shows the completion of this mesa-etching step.

Now, the etching mask 29 of $SiO_2$ is completely removed and a new $SiO_2$ film 34 having a thickness of 5000 Å is formed by the CVD method. A positive photoresist layer is formed on the $SiO_2$ film 34 and openings are formed in the positive photoresist layer so as to provide a source and a drain electrodes. Triple layers of Au-Ge alloy, Ni and Au layers are formed as the source and drain electrodes by vacuum evaporation, each triple layer having a thickness of 2500 Å. During the vacuum evaporation process, the substrate may be kept at room temperatures. Next, the positive photoresist film is removed so that the triple layer except those portions serving as the source and drain electrodes is removed. The thus prepared structure is heated at 400° C. and the ohmic contact electrodes 35 and 36 are finished.

Figure 7:
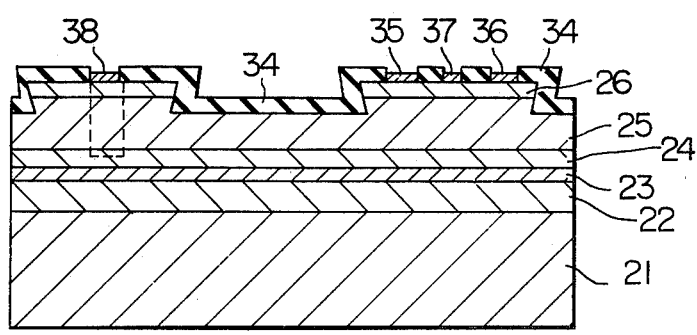

A positive photoresist film is again formed and openings are cut in the positive photoresist film so as to provide an electrode for the laser element and a gate electrode for the FET. Cr and Au are successively vacuum-deposited to form layers of 3000 Å for serving as the electrodes. The substrate is kept at 90° C. during the vacuum-deposition. The positive photoresist film is removed so that the Cr-Au layer except those portions serving as the electrodes 37 and 38 is removed. FIG. 7 shows this step of forming the electrodes.

Further, a positive photoresist film having a thickness of 1.2 μm is formed and openings are cut in the photoresist film to form external terminals for the electrodes 36 and 37 and a short-circuiting conductor between the electrodes 35 and 38. By using the photoresist film as an etching mask, the exposed portions of the SiO$_2$ film is so etched down that the thickness of the SiO$_2$ film may be reduced to 1500 Å. Cr (600 Å) and Au (3000 Å) are successively vapor-deposited to form the short-circuiting conductor 39 and the external terminal 39'.

The reverse side of the substrate 21 is polished and slightly etched and then an Au-Ge alloy is vapor-deposited to form an n-side electrode 40.

Finally, an optical resonator is completed by the well-known cleaving the thus prepared structure along a crystal plane perpendicular to the direction of the propagation of the laser beam. The cavity length is 300 μm in this case.

Figure 8:
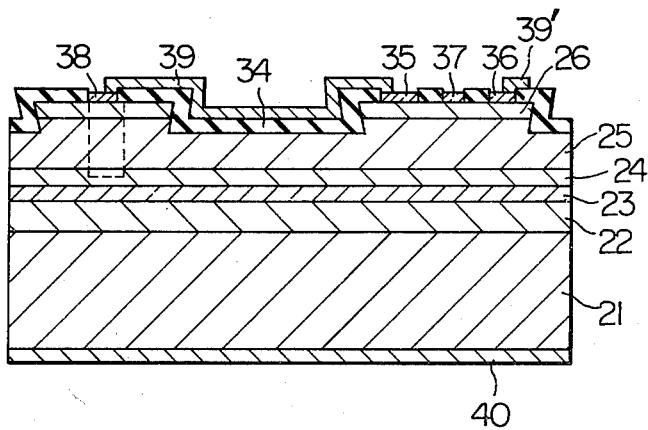
Figure 9:
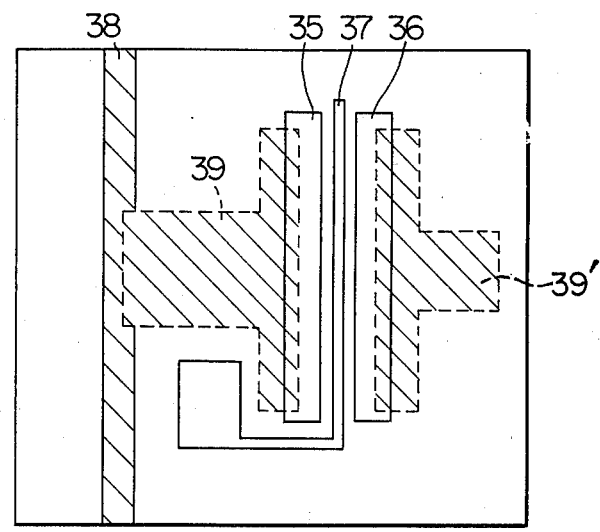
FIG. 9 is a plan view of an SLEE.

FIGS. 8 and 9 show in cross section and in plan the thus completed SLEE. In FIGS. 8 and 9, the equivalent parts are designated by the same reference numeral.

When a voltage of 4 to 5 V is applied between the drain electrode 36 and the n-side electrode 40 of the SLEE, laser resonance takes place. The wavelength of the laser light is 8300 Å and the threshold current is about 80 mA.

Figure 10:
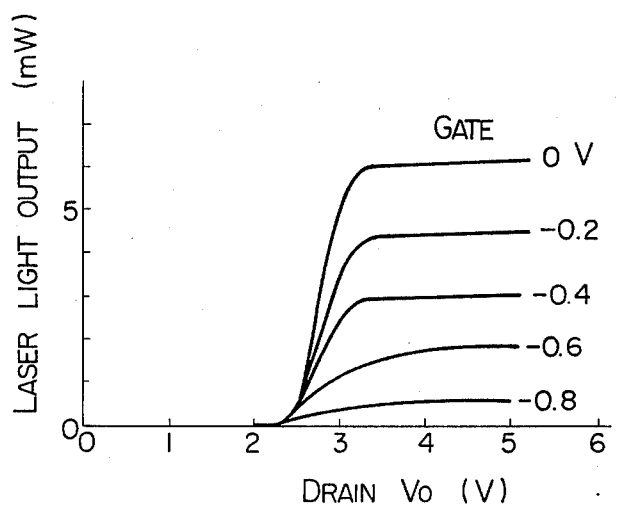
FIG. 10 shows the light emitting characteristic of the SLEE.

FIG. 10 shows an operating characteristic of the SLEE obtained above according to this invention. The gate voltage is employed as the parameter in FIG. 10. As shown in FIG. 10, laser emission takes place by setting the drain voltage Vo above 3 V. The optical output, which can be controlled by the gate voltage, was varied over a range of 6 mW to 0 mW for the change in the gate voltage of 0 to −0.8 V.

Figure 11:
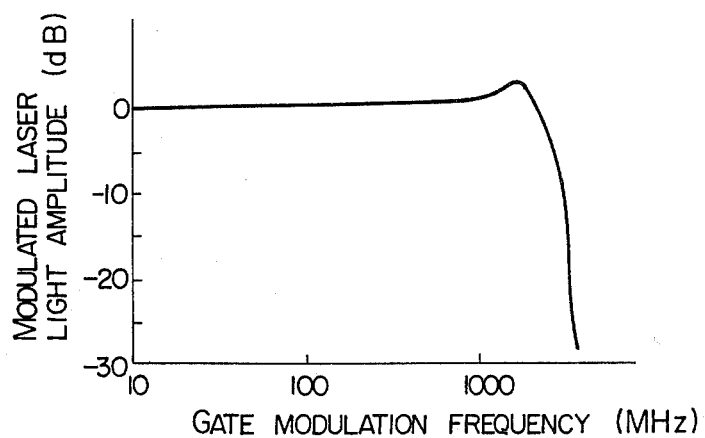
FIG. 11 shows the modulation characteristic of the SLEE.

FIG. 11 shows the result of the modulation experiment performed on the same SLEE. The curve represents the relationship between the optical output and the modulation frequency, observed in the case where the drain voltage Vo is 4 V and a sine wave having an amplitude of 0.2 V is applied to the gate. The modulation frequency range was about 2.56 GHz, which is higher than any other modulation frequency range every reported.

This invention can also be realized by semiconductor materials other than the above described material of GaAs-GaAlAs system.

For example, an SLEE according to this invention can also be realized by the use of the following structure in which a first semiconductor layer is of $Ga_xIn_{1-x}As_yP_{1-y}$ ($0 \leq x,y \leq 1$), a second semiconductor layer of $Ga_sIn_{1-s}As_tP_{1-t}$ ($0 \leq s,t \leq 1$), a third semiconductor layer of InP, a fourth semiconductor layer of $Ga_wIn_{1-w}As_zP_{1-z}$ ($0 \leq w,z \leq 1$), and a fifth semiconductor layer of $Ga_uIn_{1-u}As_vP_{1-v}$ ($0 \leq u,v \leq 1$) where s>x and w>u.

The process for forming this structure is the same in the basic steps as that described before and therefore the main part of this structure will be briefly described.

An InP substrate (Sn doped, dopant concentration $3 \times 10^{18}/cm^3$)) having its (100) plane as a crystal growing surface is used. On the (100) plane of the InP substrate are formed through liquid epitaxial growth a first semiconductor layer of n-type InP (Te doped, $n \sim 3 \times 10^{18}/cm^3$), 3 μm thick; a second semiconductor layer of p-type $In_{0.73}Ga_{0.27}As_{0.59}P_{0.41}$ (Zn doped, $p \approx 1 \times 10^{18}/cm^3$), 0.2 μm thick; a third semiconductor layer of p-type InP (Zn doped, $p \approx 2 \times 10^{18}/cm^3$), 2 μm thick; a fourth semiconductor layer of InP ($p \approx 10^{14}/cm^3$), 2 μm thick; and a fifth semiconductor layer of n-type InP (Sn doped, $n \approx 1 \times 10^{17}/cm^3$), 0.2 μm thick. The fourth semiconductor layer of InP may be replaced by a highly resistive layer with Fe doped therein.

As in the previous embodiment, Zn is diffused into the region of the surface of the laser section where an electrode is to be attached.

The p-side electrode of the laser element is formed of Au-Zn system, the n-side electrode of the laser element is of Au-Ge system, the gate electrode, i.e. Schottky electrode, of the FET is of Cr-Au system, and the source and the drain electrodes of the FET is of Au-Ge system.

As a result of this process, an SLEE having a resonance wavelength of 1.3 μm and a threshold current of 100 mA could be realized. In this example, every component was adjusted to produce laser light having a wavelength of 1.3 μm, but it is also possible to provide a laser element having a wider range of wavelengths, e.g. 1.0 to 1.7 μm, by controlling the composition of the second layer of $Ga_xIn_{1-x}As_yP_{1-y}$ by changing x and y in such a manner that the lattice constant of the second layer becomes equal to that of InP, i.e. the lattice constant a=5.87 Å.

EMBODIMENT 2

Figure 12:
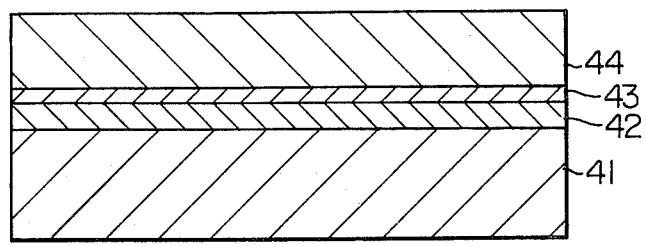
FIG. 12 to FIG. 14 show in cross section the steps of a process for producing an SLEE, as another embodiment of this invention.
Figure 13:
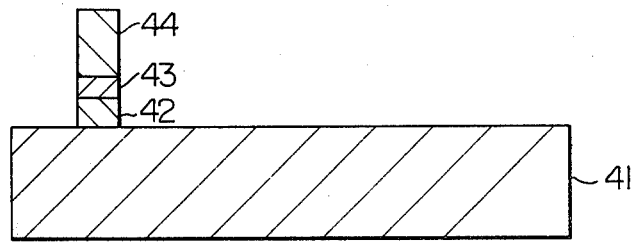
Figure 14:
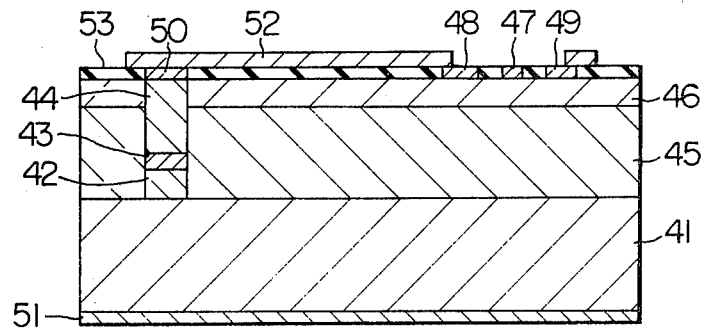

FIGS. 12 to 14 show in cross section the steps of a process for producing an SLEE as another embodiment of this invention. As shown in FIG. 12, a first layer 42 of n-type $Ga_{0.65}Al_{0.35}As$ ($n \approx 10^{18}/cm^3$, 1.6 μm thick), a second layer 43 of n-type $Ga_{0.95}Al_{0.05}As$ ($n \approx 10^{17}/cm^3$, 0.1 μm thick) and a third layer 44 of p-type $Ga_{0.65}Al_{0.35}As$ ($p \approx 5 \times 10^{18}/cm^3$, 2 μm thick) are successively formed on the (100) plane of an n-type GaAs substrate 41 (electron concentration $n \approx 10^{18}/cm^3$).

A SiO$_2$ film of 5000 Å thickness is formed on the third semiconductor layer 44 by the CVD method. This SiO$_2$ film is then so etched by the well-known photo-lithography that only a strip, 5 μm wide, of SiO$_2$ film may be left on the layer 44 as shown in FIG. 13. With this stripe used as an etching mask, the layers 42, 43 and 44 are etched off by an etching solution consisting of phosphoric acid, hydrogen peroxide and water.

A fourth layer 45, 2.5 μm thick, of p-type $Ga_{0.6}Al_{0.4}As$ (hole concentration $p \approx 10^{14}/cm^3$) and a fifth layer 46, 0.3 μm thick, of n-type GaAs ($n \approx 1 \times 10^{17}/cm^3$) are formed on the exposed surface of the substrate 41 by the liquid phase epitaxial growth method.

As in the previous embodiment, a passivation film 53 of SiO$_2$, electrodes 47, 48 and 49 of an FET, electrodes 48 and 50 of a laser element, and a short-circuiting conductor 52 are formed. The materials may be the same as used in the previous embodiment.

An n-side electrode 51 is formed on the opposite surface of the substrate 41 and finally an optical resonator is completed by cleaving the thus formed structure along a plane perpendicular to the direction of the propagation of laser beam. The cavity length was 300 μm in this case. The completed SLEE is shown in cross section in FIG. 14.

The thus fabricated laser apparatus had a threshold current of 11 to 30 mA and its output could be varied over a range of 3 mW to 0 mW by changing the gate voltage over a range of 0 to −0.2 V.

What is claimed is:

1. A semiconductor light emitting element comprising:
   a semiconductor substrate,
   a laminate region of semiconductor layers having at least a first, a second and a third semiconductor layer formed over said substrate and having a p-n junction defined therein, said first and third semiconductor layers having smaller refractive indices and greater forbidden band gaps than said second semiconductor layer and being opposite in conductivity type to each other to determine laser oscillation,
   a field effect transistor section comprising a fourth semiconductor layer having a high resistivity and formed over said third semiconductor layer and
   a fifth semiconductor layer formed on said fourth semiconductor layer, said
   field effect transistor section having first and second electrodes and a gate electrode disposed between said first and second electrodes formed on said fifth layer,
   means for serving as an optical resonator for emitting light in the lengthwise direction of said p-n junction, and
   first means formed on one surface of said laminate region and second means formed on said substrate for injecting current into said third semiconductor layer, said first means for injecting current being short-circuited with said first electrode of said field effect transistor section.

2. A semiconductor light emitting element as claimed in claim 1, wherein said fourth layer is formed on said lamination of said first, second and third layers and said means for injecting current is so formed as to penetrate said fifth and fourth layers.

3. A semiconductor light emitting element as claimed in claim 1, wherein a region of high resistivity is formed between said field effect transistor section and said optical resonator.

4. A semiconductor light emitting element as claimed in claim 2, wherein a region which provides electrical isolation at least between said field effect transistor section and said optical resonator, is formed in said fifth layer.

5. A semiconductor light emitting element as claimed in claim 1, wherein a groove whose bottom reaches said first layer is formed between said field effect transistor section and said optical resonator.

6. A semiconductor light emitting element comprising:
   a semiconductor substrate,
   a laminate region of semiconductor layers having at least a first, a second and a third semiconductor layer formed over said substrate and having a p-n junction defined therein, said first and third semiconductor layers having smaller refractive indices and greater forbidden band gaps than said second semiconductor layer and being opposite in conductivity type to each other to determine laser oscillation,
   a field effect transistor section having first and second electrodes and a gate electrode disposed between said first and second electrodes,
   means for serving as an optical resonator for emitting light in the lengthwise direction of said p-n junction,
   first means formed on one surface of said laminate region and second means formed on said substrate for injecting current into said third semiconductor layer, said first means for injecting current being short-circuited with said first electrode of said field effect transistor section wherein said field effect transistor section comprises a fourth semiconductor layer having a high resistivity and formed on said substrate, a fifth semiconductor layer formed on said fourth layer, a gate electrode formed on said fifth layer, and a first and a second electrode formed on both sides of said gate electrode on said fifth layer.

7. A semiconductor light emitting element as claimed in claims 1, 6, 2 or 3, wherein said substrate is of GaAs crystal and said first, second, third, fourth and fifth layers are respectively formed of $Ga_{1-x}Al_xAs$ ($0.2 \leq x \leq 0.7$), $Ga_{1-y}Al_yAs$ ($0 \leq y \leq 0.3$), $Ga_{1-z}Al_zAs$ ($0.2 \leq z \leq 0.7$), $Ga_{1-s}Al_sAs_s$ ($0 \leq s \leq 0.7$) and $Ga_{1-t}Al_tAs_t$ ($0 \leq t \leq 0.3$), where $z<y$, $z<s$ and $t<s$.

8. A semiconductor light emitting element as claimed in claims 1, 6, 2 or 3, wherein said substrate is of InP crystal and said first, second, third, fourth and fifth layers are respectively formed of $Ga_xIn_{1-x}As_yP_{1-y}$ ($0 \leq x,y \leq 1$), $Ga_sIn_{1-s}As_tP_{1-t}$ ($0 \leq s,t \leq 1$), InP, $Ga_wIn_{1-w}As_zP_{1-z}$ ($0 \leq w,z \leq 1$) and $Ga_uIn_{1-u}As_vP_{1-v}$ ($0 \leq u,v \leq 1$), where $s>x$ and $w>u$.

9. A semiconductor light emitting element as claimed in claim 6, wherein a groove is formed between said field effect transistor section and said optical resonator.

* * * * *